United States Patent
Yoo et al.

(10) Patent No.: US 10,287,468 B2
(45) Date of Patent: May 14, 2019

(54) CMP SLURRY COMPOSITION FOR ORGANIC FILM AND POLISHING METHOD USING SAME

(71) Applicant: SAMSUNG SDI CO., LTD., Yongin-si, Gyeonggi-do (KR)

(72) Inventors: Yong Sik Yoo, Uiwang-si (KR); Jung Min Choi, Uiwang-si (KR); Dong Hun Kang, Uiwang-si (KR); Tae Wan Kim, Uiwang-si (KR); Go Un Kim, Uiwang-si (KR); Yong Kuk Kim, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/326,199

(22) PCT Filed: Jun. 10, 2015

(86) PCT No.: PCT/KR2015/005856
§ 371 (c)(1),
(2) Date: Jan. 13, 2017

(87) PCT Pub. No.: WO2016/080614
PCT Pub. Date: May 26, 2016

(65) Prior Publication Data
US 2017/0204312 A1 Jul. 20, 2017

(30) Foreign Application Priority Data
Nov. 19, 2014 (KR) ........................ 10-2014-0161958

(51) Int. Cl.
*C09K 3/14* (2006.01)
*H01L 21/304* (2006.01)
*H01L 21/3105* (2006.01)

(52) U.S. Cl.
CPC .............. *C09K 3/14* (2013.01); *H01L 21/304* (2013.01); *H01L 21/31058* (2013.01)

(58) Field of Classification Search
CPC .... C09K 3/14; H01L 21/304; H01L 21/31058
See application file for complete search history.

(56) References Cited

U.S. PATENT DOCUMENTS

| | | | |
|---|---|---|---|
| 6,830,503 B1 | 12/2004 | Grumbine | |
| 2005/0181609 A1* | 8/2005 | Kurata | ................ B24B 37/0056 438/689 |

(Continued)

FOREIGN PATENT DOCUMENTS

| | | |
|---|---|---|
| JP | 2007-067089 A | 3/2007 |
| KR | 2002-0068050 A | 8/2002 |

(Continued)

OTHER PUBLICATIONS

Office Action dated Feb. 8, 2018 in the corresponding Chinese Patent Application No. 2015800490639.

*Primary Examiner* — Duy Vu N Deo
(74) *Attorney, Agent, or Firm* — Lee & Morse, P.C.

(57) ABSTRACT

The present invention relates to a CMP slurry composition, for an organic film, for polishing an organic film and an organic film polishing method using same, the CMP slurry composition comprising: a polar solvent and/or a non-polar solvent; metal oxide abrasives; an oxidant; and a heterocyclic compound, wherein the heterocyclic compound, as a heteroatom, comprises one or two of oxygen (O) atom, sulfur (S) atom and nitrogen (N) atom and has carbon content of 50-95 atom %.

11 Claims, 1 Drawing Sheet

(a)

(b)

(56) References Cited

U.S. PATENT DOCUMENTS

2014/0209566 A1* 7/2014 Fu .................. C09G 1/02
                                                   216/53
2015/0021513 A1* 1/2015 Kim ............. C09K 3/1463
                                                   252/79.4

FOREIGN PATENT DOCUMENTS

| KR | 10-2007-0057009 A | 6/2007 |
| KR | 10-2008-0056293 A | 6/2008 |
| KR | 10-2014-0125316 A | 10/2014 |
| TW | 201431989 A | 8/2014 |
| WO | WO 2014/171766 A1 | 10/2014 |

* cited by examiner

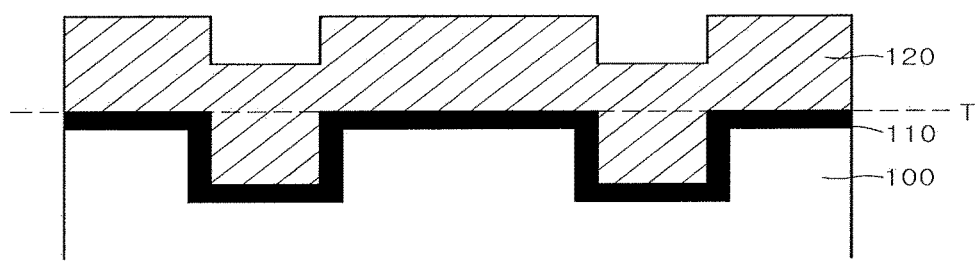
(a)
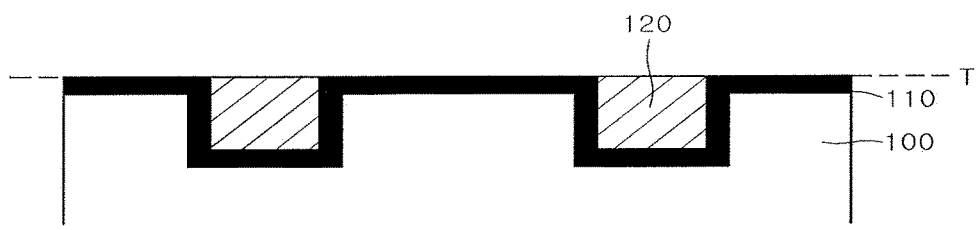
(b)

CMP SLURRY COMPOSITION FOR ORGANIC FILM AND POLISHING METHOD USING SAME

CROSS REFERENCE TO RELATED APPLICATIONS

This is the U.S. national phase application based on PCT Application No. PCT/KR2015/005856, filed Jun. 10, 2015, which is based on Korean Patent Application No. 10-2014-0161958, filed Nov. 19, 2014, the entire contents of all of which are hereby incorporated by reference.

TECHNICAL FIELD

The present invention relates to a chemical mechanical polishing (CMP) slurry composition for organic films and a polishing method using the same.

BACKGROUND ART

A semiconductor manufacturing method includes a process of forming an inorganic film, for example, a silicon oxide film or a silicon nitride film, on a patterned silicon wafer and a process of gap-filling via-holes formed in the inorganic film. The gap-filling process is performed to fill via-holes with organic film materials, and after the gap-filling process, a planarization process is performed to remove an excess of the organic film. For planarization, CMP (chemical mechanical polishing) has attracted attention in the art.

A typical CMP slurry composition for organic films includes polymer polishing particles in order to allow an organic film to be polished at a high polishing rate without deterioration in surface conditions such as scratches. However, since all organic films are not formed of the same material, such a typical CMP slurry composition fails to achieve a desired polishing rate with respect to some kinds of organic films while enhancing a degree of flatness of a polished surface. Moreover, when metal oxide abrasives used in polishing of metal films such as silicon and the like are used in polishing of organic films, it is difficult to achieve a desired polishing amount with respect to some kinds of organic films, and/or the degree of flatness of a polished surface can be lowered due to scratches and the like. One example of the related art is disclosed in Korean Patent Publication No. 2007-0057009A.

DISCLOSURE

Technical Problem

It is an aspect of the present invention to provide a CMP slurry composition for organic films which has excellent effects in polishing an organic film having a high carbon content, high film density and high hardness.

It is another aspect of the present invention to provide a CMP slurry composition for organic films which provides good flatness of a polished surface after polishing an organic film having a high carbon content, high film density and high hardness, and which allows more uniform polishing by easily removing a residual organic film from a polishing stop layer.

Technical Solution

One aspect of the present invention provides a CMP slurry composition for organic films, including at least one of a polar solvent and a non-polar solvent; a metal oxide abrasive; an oxidant; and a heterocyclic compound, wherein the heterocyclic compound includes one or two hetero atoms selected from among oxygen (O), sulfur (S) and nitrogen (N), and the CMP slurry composition is capable of polishing an organic film having a carbon content of 50 atom % to 95 atom %.

The organic film may have a film density of 0.5 g/cm³ to 2.5 g/cm³ and a hardness of 0.4 GPa or more.

The organic film may have a film density of 1.0 g/cm³ to 2.0 g/cm³ and a hardness of 1.0 GPa or more.

The metal oxide abrasive may include at least one of silica, alumina, ceria, titania, and zirconia.

The metal oxide abrasive may be present in an amount of 0.01 wt % to 5 wt % in the composition.

The heterocyclic compound may be present in an amount of 0.001 wt % to 5 wt % in the composition.

The heterocyclic compound may have a 5-membered ring structure or a 6-membered ring structure.

The oxidant and the heterocyclic compound may be present in a weight ratio of 1:0.01 to 1:1.

The oxidant may include at least one of a metal salt in a polyvalent oxidation state and a transition metal chelate.

The oxidant may be present in an amount of 0.001 wt % to 5 wt % in the composition.

The metal salt in the polyvalent oxidation state may include at least one of ceric ammonium salts, ferric nitrates, and ferric chlorides.

The organic film may have an acid value of 0 mgKOH/g.

Another aspect of the present invention provides a method of polishing an organic film, including an organic film using the CMP slurry composition for organic films, wherein the organic film has a carbon content of 50 atm % to 95 atm %, a film density of 0.5 g/cm³ to 2.5 g/cm³, and a hardness of 0.4 GPa or more.

Advantageous Effects

According to the present invention, the CMP slurry composition provides an excellent effect in polishing an organic film having a high carbon content, high film density and high hardness, provides good flatness of a polished surface after polishing the organic film, and allows more uniform polishing by easily removing residual organic film from a polishing stop layer.

BRIEF DESCRIPTION OF DRAWINGS

FIG. 1 is a diagram of a method of polishing an organic film according to one embodiment of the present invention.

BEST MODE

CMP Slurry Composition for Organic Films

According to one embodiment of the present invention, a CMP slurry composition for organic films may include at least one of a polar solvent and a non-polar solvent; a metal oxide abrasive; an oxidant; and a heterocyclic compound. As a result, the CMP slurry composition can be used to polish an organic film at a high polishing rate without scratching, while improving flatness of a polished surface.

The polar and/or non-polar solvents reduce friction when an organic film having a high carbon content is polished with the metal oxide abrasive, and may include, for example, water, ultrapure water, organic amines, organic alcohols, organic alcohol amines, organic ethers, organic ketones, and the like. For example, the polar and/or non-polar solvents may be ultrapure water. The polar and/or non-polar solvents may be present in the balance amount in the CMP slurry composition.

The metal oxide abrasive is provided to polish an organic film having a high carbon content, high film density and high hardness at a high polishing rate. In particular, upon polishing the organic film according to the present invention, the metal oxide abrasive does not generate scratches, thereby improving flatness of a polished surface. Specifically, the metal oxide abrasive may include at least one selected from among silica, alumina, ceria, titania, and zirconia. Particularly, silica providing better dispersion stability and ceria providing a higher polishing rate are preferred.

The metal oxide abrasive may be spherical particles and have an average particle diameter of 10 nm to 150 nm, for example, 30 nm to 70 nm. Within this range, the metal oxide abrasive can provide a sufficient polishing rate with respect to the organic film according to the present invention without generating scratches, while improving flatness of a polished surface.

The metal oxide abrasive may be present in an amount of 0.01% by weight (wt %) to 5 wt %, for example, 0.01 wt % to 3 wt %, in the CMP slurry composition. Within this range, the metal oxide abrasive can provide a sufficient polishing rate with respect to the organic film without generating scratches, and can exhibit good dispersion stability. Preferably, the CMP slurry composition for organic films has an improved polishing rate with respect to the organic film and a low polishing rate with respect to an inorganic film by increasing the average particle diameter of the metal oxide abrasive while reducing the amount of the metal oxide abrasive in the slurry composition.

The oxidant facilitates polishing of an organic film having a high carbon content, high film density and high hardness by oxidizing a surface layer of the organic film, and allows the organic film to have a uniform surface so as to realize good surface roughness of a polished surface when an inorganic film is exposed by polishing. In addition, the oxidant facilitates removal of a residual organic film on the inorganic film, thereby allowing the organic film to be uniformly polished.

Specifically, the oxidant may include at least one of a metal salt in a polyvalent oxidation state and a transition metal chelate. Herein, the term "polyvalent" refers to divalent or higher, for example, trivalent or higher, for example, tetravalent or higher.

The metal salt in the polyvalent oxidation state increases a polishing rate with respect to the organic film while reducing the polishing rate with respect to an inorganic film. The metal salt may include metals such as transition metals, lanthanides and the like, and may additionally include halogens, ammonium, nitrates, and the like. For example, the metal salts may include ceric ammonium salts, ferric halogen salts, ferric nitrates, and the like, more specifically ceric ammonium nitrates, ferric nitrates, ferric chlorides, and the like.

The transition metal chelate increases the polishing rate with respect to the organic film while reducing the polishing rate with respect to an inorganic film.

In the transition metal chelate, the transition metal may include typically known group III to XII transition metals, for example, iron, copper, manganese, and chromium. The chelate may include oxalic acid, amino-substituted carboxylic acids (for example, aminopolycarboxylates such as iminodiacetic acid, ethylenediamine disuccinic acid, iminodisuccinic acid, ethylenediaminetetraacetic acid and nitrilotriacetic acid, α-amino acids such as glycine, and beta-amino acids), hydroxyl group-substituted carboxylic acids (for example, glycolic acid, lactic acid, and hydroxyl group-containing polycarboxylic acids such as malic acid, citric acid, and tartaric acid), phosphonocarboxylic acids, aminophosphonic acids, and combinations thereof. For example, the transition metal chelate may include at least one of Fe-containing compounds including propylenediamine tetraacetic acid-Fe, and Mn-containing compounds including propylenediamine tetraacetic acid-Mn, without being limited thereto.

The oxidant may be present in an amount of about 0.001 wt % to about 5 wt %, for example, about 0.01 wt % to about 3 wt %, or about 0.05 to about 3 wt %, in the CMP slurry composition. Within this range, the CMP slurry composition can maintain suitable etching properties with respect to the organic film. When the CMP slurry composition is acidic, the oxidant exhibits good stability, whereby the CMP slurry composition can increase a polishing rate with respect to the organic film, improve the degree of flatness of a polished surface, and increase polishing selectivity to an inorganic film.

The heterocyclic compound is an organic compound having a cyclic chemical structure, which includes not only carbon atoms but also a heteroatom selected from among oxygen (O), sulfur (S) and nitrogen (N).

The heterocyclic compound may include one or two heteroatoms and may have a 5-membered or a 6-membered cyclic structure. With the heterocyclic compound having such a cyclic structure, the slurry composition can suppress generation of organic film defects while increasing the polishing rate with respect to the organic film.

Examples of the heterocyclic compound having a 5-membered cyclic structure including one heteroatom may include: pyrrolidine or pyrrole containing nitrogen (N) as a heteroatom; tetrahydrofuran or furan containing oxygen (O) as a heteroatom; thiolane or thiophene containing sulfur (S) as a heteroatom; and derivatives thereof.

Examples of the heterocyclic compound having a 6-membered cyclic structure including one heteroatom may include piperidine or pyridine containing nitrogen (N) as a heteroatom; oxane or pyran containing oxygen (O) as a heteroatom; thiane or thiopyran containing sulfur (S) as a heteroatom; and derivatives thereof.

Examples of the heterocyclic compound having a 5-membered cyclic structure including two heteroatoms may include imidazolidine, pyrazolidine, imidazole, pyrazole, oxazolidine, oxazole, isothiazolidine, thiazole, dioxolane, dithiolane, histidine, and derivatives thereof.

Examples of the heterocyclic compound having a 6-membered cyclic structure including two heteroatoms may include piperazine, pyrimidine, diazines, morpholine, oxazine, thiomorpholine, thiazine, dioxane, dioxine, dithiane, dithiine, and derivatives thereof.

The heterocyclic compound may be present in an amount of 0.001 wt % to 5 wt %, for example, 0.005 wt % to 2 wt %, or 0.005 wt % to 1 wt %, in the CMP slurry composition. Within this range, the CMP slurry composition can exhibit a high polishing rate with respect to the organic film and can secure good flatness of a polished surface.

In one embodiment, the oxidant and the heterocyclic compound may be present in a weight ratio of 1:0.01 to 1:1, specifically 1:0.05 to 1:0.5, in the CMP slurry composition. Within this range, the heterocyclic compound aids oxidation of the oxidant, thereby improving etching performance with respect to the organic film while maximizing polishing effects.

In some embodiments, the CMP slurry composition may be acidic. In these embodiments, the CMP slurry composition can increase polishing selectivity to an organic film, and can improve a polishing rate with respect to the organic film and flatness of a polished surface. Specifically, the CMP slurry composition may have a pH of 5 or less, specifically 4 or less, more specifically 1 to 3.5. For example, the CMP slurry composition may be regulated to have a pH within this range using a pH regulator. The pH regulator may include: inorganic acids, for example, at least one of nitric acid, phosphoric acid, hydrochloric acid, and sulfuric acid; and organic acids, for example, organic acids having a pKa of 5 or less, for example, at least one of acetic acid and citric acid, without being limited thereto.

The CMP slurry composition may further include an additive. For example, the CMP slurry composition may further include a polishing accelerator as the additive. The polishing accelerator can increase polishing selectivity to an inorganic film by suppressing a polishing rate with respect to the inorganic film. The polishing accelerator may include organic acids, for example, at least one of malic acid, citric acid, formic acid, glutaric acid, oxalic acid, phthalic acid, succinic acid, tartaric acid, maleic acid, and malonic acid. The polishing accelerator may be present in an amount of 0.02 wt % to 0.5 wt % in the CMP slurry composition. Within this range, the polishing accelerator does not have an adverse effect on polishing rate, dispersion stability of slurries, and surface properties of an organic carbon film.

According to one embodiment of the present invention, the CMP slurry composition may have a polishing rate of 100 Å/min to 8,000 Å/min with respect to an organic film, specifically about 500 Å/min to about 5000 Å/min.

Polishing Target of CMP Slurry Composition

Hereinafter, an organic film, which is a polishing target of the CMP slurry composition according to the present invention, will be described in detail.

As used herein, the term "substituted" in "substituted or unsubstituted" means that at least one hydrogen atom of a corresponding functional group is substituted with a hydroxyl group, a halogen atom, a thionyl group, a thiol group, a cyano group, an amino group, a $C_1$ to $C_{30}$ alkyl group, a $C_2$ to $C_{30}$ alkenyl group, a $C_2$ to $C_{30}$ alkynyl group, a $C_3$ to $C_{30}$ cycloalkyl group, a $C_3$ to $C_{30}$ cycloalkenyl group, a $C_6$ to $C_{30}$ aryl group, a $C_7$ to $C_{30}$ arylalkyl group, a $C_1$ to $C_{20}$ heteroalkyl group, a $C_2$ to $C_{30}$ heterocycloalkyl group, a $C_2$ to $C_{30}$ heterocycloalkenyl group, a $C_2$ to $C_{30}$ heteroaryl group, a $C_2$ to $C_{30}$ heteroarylalkyl group, a $C_1$ to $C_{20}$ alkyl amine group, a $C_1$ to $C_{30}$ alkoxy group, a $C_6$ to $C_{30}$ aryloxy group, a $C_1$ to $C_{20}$ aldehyde group, a $C_1$ to $C_{40}$ alkylether group, a $C_7$ to $C_{20}$ arylalkylene ether group, a $C_1$ to $C_{30}$ haloalkyl group, a P-containing functional group, a B-containing functional group, or a combination thereof.

Herein, the "P-containing functional group" may be represented by Formula A and the "B-containing functional group" may be represented by Formula B:

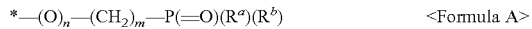  <Formula A>

  <Formula B>

(wherein n is 0 or 1; m is an integer of 0 to 10; and $R^a$, $R^b$, $R^c$ and $R^d$ are each independently hydrogen, a hydroxyl group, a substituted or unsubstituted $C_1$ to $C_{20}$ alkyl group, a substituted or unsubstituted $C_2$ to $C_{20}$ alkenyl group, a substituted or unsubstituted $C_3$ to $C_{20}$ cycloalkyl group, a substituted or unsubstituted $C_1$ to $C_{20}$ haloalkyl group, a substituted or unsubstituted $C_1$ to $C_{20}$ alkyl sulfonate group, a substituted or unsubstituted $C_1$ to $C_{20}$ alkylsulfonyl group, a substituted or unsubstituted $C_2$ to $C_{20}$ alkylamide group, a substituted or unsubstituted $C_3$ to $C_{20}$ alkyl ester group, a substituted or unsubstituted $C_2$ to $C_{20}$ cyanoalkyl group, a substituted or unsubstituted $C_1$ to $C_{20}$ alkoxy group, a substituted or unsubstituted $C_6$ to $C_{30}$ aryl group, a substituted or unsubstituted $C_6$ to $C_{30}$ arylalkyl group, or a substituted or unsubstituted $C_6$ to $C_{30}$ aryloxy group, or $R^a$ and $R^b$ or $R^c$ and $R^d$ are connected to each other to form a substituted or unsubstituted $C_3$ to $C_{20}$ cycloalkyl group or a substituted or unsubstituted $C_3$ to $C_{20}$ heterocycloalkyl group).

Preferably, the P-containing functional group is a P and O-containing functional group, for example, —P(=O)(OH)$_2$, —O—P(=O)(OH)$_2$, —P(=O)(OCH$_2$CH$_3$)$_2$, and —P(=O)(C$_2$H$_4$C$_6$H$_5$)(OCH$_2$CH$_3$), and the B-containing functional group is a B and O-containing functional group, for example, —B(OH)$_2$, —B(H)(CH$_3$), and —B(CH$_2$CH$_3$)$_2$.

When an inorganic film is deposited on a patterned wafer, for example, a patterned silicon wafer, an organic film fills via-holes formed therein. The CMP slurry composition needs to polish the organic film at a sufficient polishing rate for planarization of the deposited film, needs to improve the degree of flatness of a polished surface, and needs to allow easy removal of residues on the inorganic film after polishing. The inorganic film may be formed of at least one of silicon oxide and silicon nitride, without being limited thereto.

The organic film may have a significantly different polishing rate and flatness after polishing depending upon materials of the organic film. The CMP slurry composition according to the present invention is a composition for polishing an organic film having a high carbon content. When the organic film is polished using the CMP slurry composition, the CMP slurry composition can improve the polishing rate and flatness of the organic film, and can facilitate removal of residues from the inorganic film after polishing.

As a polishing target, since the organic film according to the present invention has a higher carbon content, a higher film density and higher hardness than typical organic films, the organic film cannot be polished with a typical CMP slurry composition containing polymer particles. On the other hand, the CMP slurry composition according to the present invention is capable of polishing the organic film at a high polishing rate without deteriorating surface conditions due to scratches. Specifically, the CMP slurry composition according to the present invention has a polishing rate of 500 Å/min or more, for example, 1,000 Å/min or more, and may range, for example, from about 500 Å/min to about 5,000 Å/min, with respect to the organic film. Within this range, the CMP slurry composition can secure a sufficient polishing rate with respect to the organic film.

In some embodiments, the organic film may have a carbon content of about 50 atom % to about 95 atom %, specifically about 65 atom % to about 95 atom % or about 70 atom % to about 92 atom %, for example, about 65 atom %, 66 atom %, 67 atom %, 68 atom %, 69 atom %, 70 atom %, 71 atom %, 72 atom %, 73 atom %, 74 atom %, 75 atom %, 76 atom %, 77 atom %, 78 atom %, 79 atom %, 80 atom %, 81 atom %, 82 atom %, 83 atom %, 84 atom %, 85 atom %, 86 atom %, 87 atom %, 88 atom %, 89 atom %, 90 atom %, 91 atom %, 92 atom %, 93 atom %, 94 atom %, or 95 atom %. Within this range, when polished with the metal oxide abrasive, the organic film can be polished at a high polishing rate, does not suffer from scratching, and can exhibit a high degree of flatness of a polished surface. In addition, the organic film may have a film density of about 0.5 g/cm³ to about 2.5 g/cm³, specifically about 1.0 g/cm³ to about 2.0 g/cm³ or about 1.2 g/cm³ to about 1.6 g/cm³, for example, about 0.5 g/cm³, 0.6 g/cm³, 0.7 g/cm³, 0.8 g/cm³, 0.9 g/cm³, 1.0 g/cm³, 1.1 g/cm³, 1.2 g/cm³. 1.3 g/cm³, 1.4 g/cm³, 1.5 g/cm³, 1.6 g/cm³, 1.7 g/cm³, 1.8 g/cm³, 1.9 g/cm³, 2.0 g/cm³, 2.1 g/cm³, 2.2 g/cm³, 2.3 g/cm³, 2.4 g/cm³, or 2.5 g/cm³. Within this range, when polished with the metal oxide abrasive, the organic film can be polished at a high polishing rate, does not suffer from scratching, and can exhibit a high degree of flatness of a polished surface. Further, the organic film may have a hardness of 0.4 GPa or more, specifically 1.0 GPa or more, or 1.3 GPa or more, for example, 1.0 GPa to 1.5 GPa, for example, 0.4 GPa, 0.5 GPa, 0.6 GPa, 0.7 GPa, 0.8 GPa, 0.9 GPa, 1.0 GPa, 1.1 GPa, 1.2 GPa, 1.3 GPa, 1.4 GPa, or 1.5 GPa. Within this range, when polished with the metal oxide abrasive, the organic film can be polished at a high polishing rate, does not suffer from scratching, and can exhibit a high degree of flatness of a polished surface.

Further, the organic film according to the present invention may have an acid value of substantially 0 mgKOH/g. In the case of polishing the organic film using a typical CMP slurry composition including a polymer abrasive, there is a problem of reduction in polishing rate. On the contrary, the CMP slurry composition according to the present invention can secure a sufficient organic film polishing rate for application to a CMP process. The term "substantially" means that the acid value is not only 0 mg KOH/g but also 0 mg KOH/g with an acceptable margin of error.

Specifically, the organic film according to the present invention may be produced by coating an organic film composition including a substituted or unsubstituted aromatic group-containing compound onto an inorganic film, followed by baking at a high temperature of, for example, 200° C. to 400° C.

As used herein, the term "substituted or unsubstituted aromatic group-containing compound" refers to a compound which does not decompose after baking and allows an organic film formed of the composition including the compound to have a high carbon content. The unsubstituted aromatic group may be a $C_6$ to $C_{100}$, for example, $C_6$ to $C_{50}$ unsubstituted aromatic group having a single ring structure or a polycyclic structure in which 2 or more rings are fused. For example, the unsubstituted aromatic group may include compounds represented by Formulae 1-1 to 1-26.

<Formula 1-1>

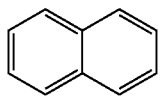

<Formula 1-2>

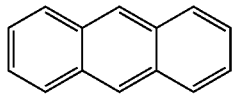

<Formula 1-3>

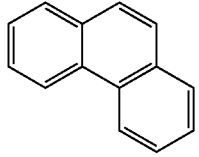

<Formula 1-4>

-continued

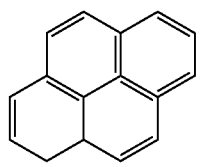

<Formula 1-5>

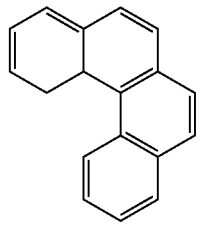

<Formula 1-6>

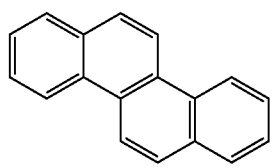

<Formula 1-7>

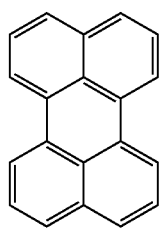

<Formula 1-8>

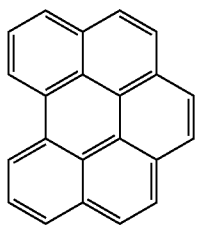

<Formula 1-9>

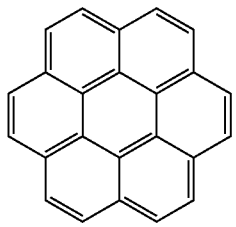

<Formula-10>

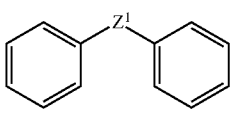

<Formula 1-11>

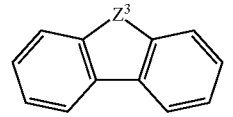

<Formula 1-12>

<Formula 1-13>

<Formula 1-14>

<Formula 1-15>

<Formula 1-16>

<Formula 17>

<Formula 1-18>

<Formula 1-19>

<Formula 1-20>

<Formula 1-21>

<Formula 22>

<Formula 1-23>

<Formula 1-24>

<Formula 1-25>

<Formula 1-26>

(wherein $Z^1$ to $Z^{18}$ are each independently a single bond, a substituted or unsubstituted $C_1$ to $C_{20}$ alkylene group, a substituted or unsubstituted $C_2$ to $C_{20}$ alkenylene group, a substituted or unsubstituted $C_2$ to $C_{20}$ alkynylene group, a substituted or unsubstituted $C_3$ to $C_{20}$ cycloalkylene group, a substituted or unsubstituted $C_3$ to $C_{20}$ cycloalkenylene group, a substituted or unsubstituted $C_6$ to $C_{20}$ arylene group, a substituted or unsubstituted $C_2$ to $C_{20}$ heteroarylene group, —(C=O)—, —NR$^e$—, —CR$^f$R$^g$—, oxygen (O), sulfur (S), or a combination thereof, R$^e$, R$^f$ and R$^g$ being each independently hydrogen, a substituted or unsubstituted $C_1$ to $C_{10}$ alkyl group, a halogen atom, a substituted or unsubstituted $C_6$ to $C_{20}$ arylene group, a substituted or unsubstituted $C_2$ to $C_{20}$ heteroarylene group, or a combination thereof).

Hereinafter, the organic film composition including the substituted or unsubstituted aromatic group-containing compound will be described in more detail.

In a first embodiment, the organic film composition may include a compound including a unit represented by Formula 2 as the substituted or unsubstituted aromatic group-containing compound:

<Formula 2>

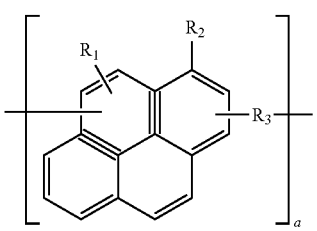

(wherein a satisfies 1≤n<190;

R₁ is hydrogen, a hydroxyl group, a halogen atom, an allyl group, a thionyl group, a thiol group, a cyano group, a substituted or unsubstituted amino group, a substituted or unsubstituted $C_1$ to $C_{30}$ alkyl group, a substituted or unsubstituted $C_1$ to $C_{30}$ heteroalkyl group, a substituted or unsubstituted $C_2$ to $C_{30}$ alkenyl group, a substituted or unsubstituted $C_2$ to $C_{30}$ alkynyl group, a substituted or unsubstituted $C_3$ to $C_{30}$ cycloalkyl group, a substituted or unsubstituted $C_2$ to $C_{30}$ heterocycloalkyl group, a substituted or unsubstituted $C_3$ to $C_{30}$ cycloalkenyl group, a substituted or unsubstituted $C_6$ to $C_{30}$ aryl group, a substituted or unsubstituted $C_7$ to $C_{30}$ arylalkyl group, a substituted or unsubstituted $C_1$ to $C_{20}$ heteroalkyl group, a substituted or unsubstituted $C_2$ to $C_{30}$ heterocycloalkyl group, a substituted or unsubstituted $C_2$ to $C_{30}$ heterocycloalkenyl group, a substituted or unsubstituted $C_2$ to $C_{30}$ heteroaryl group, a substituted or unsubstituted $C_2$ to $C_{30}$ heteroarylalkyl group, a substituted or unsubstituted $C_1$ to $C_{20}$ alkylamine group, a substituted or unsubstituted $C_1$ to $C_{30}$ alkoxy group, a substituted or unsubstituted $C_1$ to $C_{30}$ heteroalkoxy group, a substituted or unsubstituted $C_6$ to $C_{30}$ aryloxy group, a substituted or unsubstituted $C_1$ to $C_{20}$ aldehyde group, a substituted or unsubstituted $C_1$ to $C_{40}$ alkyl ether group, a substituted or unsubstituted $C_7$ to $C_{20}$ arylalkylene ether group, a substituted or unsubstituted $C_1$ to $C_{30}$ haloalkyl group, a P-containing functional group, a B-containing functional group, or a combination thereof;

R₂ is hydrogen, a substituted or unsubstituted amino group, a substituted or unsubstituted $C_1$ to $C_{20}$ alkoxy group, a substituted or unsubstituted $C_6$ to $C_{20}$ aryloxy group, —NRhRi ($R^h$ and $R^i$ being each independently a substituted or unsubstituted $C_1$ to $C_{10}$ alkyl group, or a substituted or unsubstituted $C_6$ to $C_{10}$ aryl group), a hydroxyl group, a halogen atom, an allyl group, a thionyl group, a thiol group, a cyano group, a substituted or unsubstituted C1 to C30 alkyl group, a substituted or unsubstituted $C_1$ to $C_{30}$ heteroalkyl group, a substituted or unsubstituted $C_2$ to $C_{30}$ alkenyl group, a substituted or unsubstituted $C_2$ to $C_{30}$ alkynyl group, a substituted or unsubstituted $C_2$ to $C_{30}$ cycloalkyl group, a substituted or unsubstituted $C_2$ to $C_{30}$ heterocycloalkyl group, a substituted or unsubstituted $C_3$ to $C_{30}$ cycloalkenyl group, a substituted or unsubstituted $C_6$ to $C_{30}$ aryl group, a substituted or unsubstituted $C_7$ to $C_{30}$ arylalkyl group, a substituted or unsubstituted $C_2$ to $C_{30}$ heterocycloalkyl group, a substituted or unsubstituted $C_2$ to $C_{30}$ heterocycloalkenyl group, a substituted or unsubstituted $C_2$ to $C_{30}$ heteroaryl group, a substituted or unsubstituted $C_2$ to $C_{30}$ heteroarylalkyl group, a substituted or unsubstituted $C_1$ to $C_{20}$ alkylamine group, a substituted or unsubstituted $C_1$ to $C_{30}$ heteroalkoxy group, a substituted or unsubstituted $C_1$ to $C_{20}$ aldehyde group, a substituted or unsubstituted $C_1$ to $C_{40}$ alkylether group, a substituted or unsubstituted $C_7$ to $C_{20}$ arylalkylene ether group, a substituted or unsubstituted $C_1$ to $C_{30}$ haloalkyl group, a P-containing functional group, a B-containing functional group, or a combination thereof; and R₃ is a substituted or unsubstituted

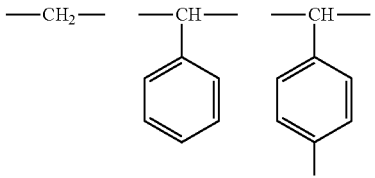

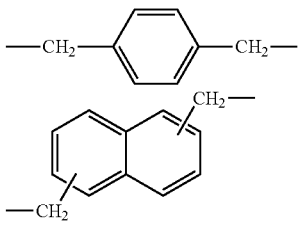

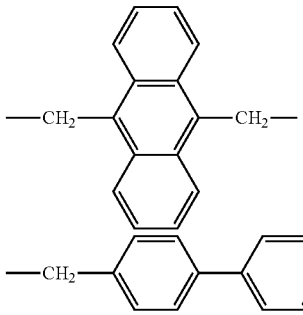

For example, R₂ may be a substituted or unsubstituted $C_1$ to $C_{10}$ alkoxy group.

The compound including the unit represented by Formula 2 can increase carbon content, film density and hardness of the organic film after baking the organic film composition. A more detailed process of preparing the material is disclosed in Korean Patent No. 10-0866015.

The organic film composition according to the first embodiment may further include at least one of a crosslinking component, an acid catalyst and an organic solvent in addition to the compound including the unit represented by Formula 2. Specifically, the composition according to the first embodiment may include 1 wt % to 20 wt % of the compound including the unit represented by Formula 2, 0.1 wt % to 5 wt % of the crosslinking component, 0.001 wt % to 0.05 wt % of the acid catalyst, and 75 wt % to 98.8 wt % of the organic solvent.

The crosslinking component may include at least one of a melamine resin (for example, an N-methoxymethyl-melamine resin, or an N-butoxymethyl-melamine resin), a methylated or butylated urea resin, an amino resin, a glycoluril derivative represented by Formula 3, a bisepoxy compound represented by Formula 4, and a melamine derivative represented by Formula 5:

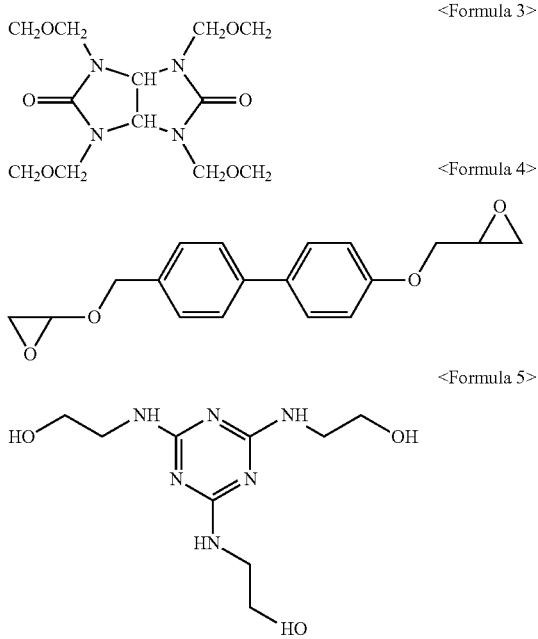

<Formula 3>
<Formula 4>
<Formula 5>

The acid catalyst may include at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

The organic solvent may be any organic solvent capable of sufficiently dissolving the substituted or unsubstituted aromatic group-containing compound without limitation. For example, the organic solvent may include propylene glycol monomethyl ether acetate, cyclohexanone, ethyl lactate, and the like.

The organic film may be produced by coating the organic film composition according to the first embodiment to a thickness of 500 Å to 4000 Å, followed by baking at 200° C. to 400° C. for 10 seconds to 10 minutes, without being limited thereto.

In a second embodiment, the organic film composition may include a compound represented by Formula 6 as the substituted or unsubstituted aromatic group-containing compound:

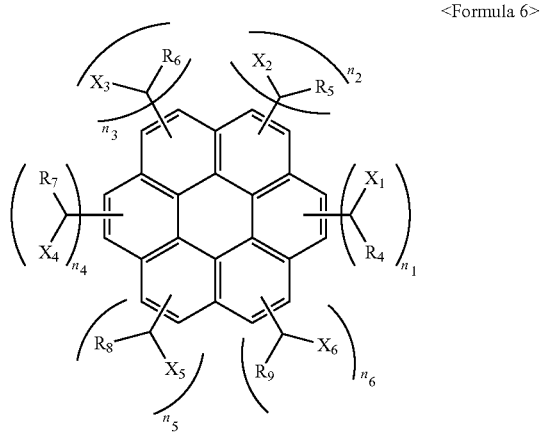

<Formula 6>

(in <Formula 6>, wherein $R_4$ to $R_9$ and $X_1$ to $X_6$ are each independently hydrogen, a hydroxyl group, a halogen atom, an allyl group, a thionyl group, a thiol group, a cyano group, a substituted or unsubstituted amino group, a substituted or unsubstituted $C_1$ to $C_{30}$ alkyl group, a substituted or unsubstituted $C_1$ to $C_{30}$ heteroalkyl group, a substituted or unsubstituted $C_2$ to $C_{30}$ alkenyl group, a substituted or unsubstituted $C_2$ to $C_{30}$ alkynyl group, a substituted or unsubstituted $C_3$ to $C_{30}$ cycloalkyl group, a substituted or unsubstituted $C_2$ to $C_{30}$ heterocycloalkyl group, a substituted or unsubstituted $C_3$ to $C_{30}$ cycloalkenyl group, a substituted or unsubstituted $C_6$ to $C_{30}$ aryl group, a substituted or unsubstituted $C_7$ to $C_{30}$ arylalkyl group, a substituted or unsubstituted $C_2$ to $C_{30}$ heterocycloalkenyl group, a substituted or unsubstituted $C_2$ to $C_{30}$ heteroaryl group, a substituted or unsubstituted $C_2$ to $C_{30}$ heteroarylalkyl group, a substituted or unsubstituted $C_1$ to $C_{20}$ alkylamine group, a substituted or unsubstituted $C_1$ to $C_{30}$ alkoxy group, a substituted or unsubstituted $C_1$ to $C_{30}$ heteroalkoxy group, a substituted or unsubstituted $C_6$ to $C_{30}$ aryloxy group, a substituted or unsubstituted $C_1$ to $C_{20}$ aldehyde group, a substituted or unsubstituted $C_1$ to $C_{40}$ alkylether group, a substituted or unsubstituted $C_7$ to $C_{20}$ arylalkylene ether group, a substituted or unsubstituted $C_1$ to $C_{30}$ haloalkyl group, a P-containing functional group, a B-containing functional group, or a combination thereof; and $n_1$ to $n_6$ each independently range from 0 to 2 and satisfy $2 \leq n_1+n_2+n_3+n_4+n_5+n_6 \leq 6$).

For example, $R_4$ to $R_9$ are each independently a substituted or unsubstituted $C_1$ to $C_{10}$ alkyl group, a substituted or unsubstituted $C_6$ to $C_{20}$ aryl group, a substituted or unsubstituted $C_3$ to $C_{20}$ cycloalkyl group, a substituted or unsubstituted $C_3$ to $C_{20}$ cycloalkenyl group, a P-containing functional group, or a B-containing functional group.

For example, $X_1$ to $X_6$ are each independently hydrogen, a hydroxyl group, a substituted or unsubstituted $C_1$ to $C_{20}$ alkylamine group, an amino group, a P-containing functional group, or a B-containing functional group.

The organic film composition according to the second embodiment is substantially the same as the organic film composition according to the first embodiment except that the organic film composition according to the second embodiment includes the compound represented by Formula 6 instead of the compound including the unit represented by Formula 2 as the substituted or unsubstituted aromatic group-containing compound. Therefore, only the compound represented by Formula 6 will be described in detail hereinafter.

The aromatic compound represented by Formula 6 may have an average molecular weight of 500 g/mol to 4,000 g/mol. Within this range, the organic film composition can form an organic film having a suitable thickness or good properties.

The compound represented by Formula 6 may be prepared by a typical method, for example, by reacting acetyl chloride, benzoyl chloride, naphthoyl chloride, or cyclohexanecarbonyl chloride with coronene, followed by reducing the resulting material, without being limited thereto. A more detailed process of preparing the compound represented by Formula 7 is disclosed in Korean Patent No. 10-1311942.

The compound represented by Formula 6 can increase carbon content, film density and hardness of the organic film after baking the organic film composition. In addition, the organic film composition including the compound represented by <Formula 6> includes an aromatic ring exhibiting strong absorption at short wavelengths (for example, 193 nm, or 248 nm) and thus can be crosslinked at high temperature even without a particular catalyst, the organic film composition including the compound represented by Formula 6 can prevent contamination due to a catalyst, particularly by an acid. The organic film composition according to the present invention may be a mixture of two or more compounds represented by Formula 6 and including substituents at different positions.

In a third embodiment, the organic film composition may include an aromatic group-containing polymer selected from among the following compounds (i), (ii) and (iii) as the substituted or unsubstituted aromatic group-containing compound:

(i) A compound including a unit represented by Formula 7;

(ii) A mixture of the compound including the unit represented by Formula 7 and a compound including a unit represented by Formula 8; and (iii) A compound including a unit represented by Formula 9.

<Formula 7>

<Formula 8>

<Formula 9>

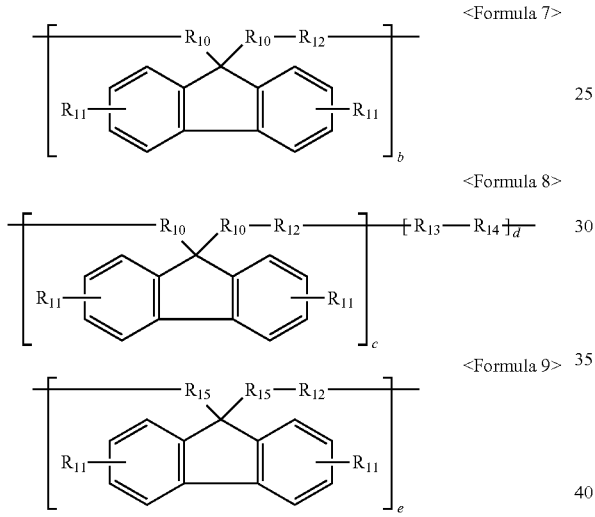

(wherein b, c, d and e are each independently 1 to 750; $2 \leq c+d < 1500$;

$R_{10}$ is any one selected from among substituted or unsubstituted compounds represented by the following formulae:

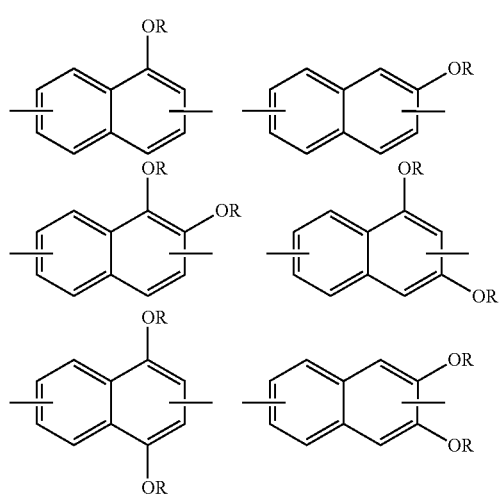

$R_{11}$ is hydrogen, a hydroxyl group, a halogen atom, a thionyl group, a thiol group, a cyano group, a substituted or unsubstituted amino group, a substituted or unsubstituted $C_1$ to $C_{30}$ alkyl group, a substituted or unsubstituted $C_1$ to $C_{30}$ heteroalkyl group, a substituted or unsubstituted $C_2$ to $C_{30}$ alkenyl group, a substituted or unsubstituted $C_2$ to $C_{30}$ alkynyl group, a substituted or unsubstituted $C_3$ to $C_{30}$ cycloalkyl group, a substituted or unsubstituted $C_1$ to $C_{30}$ heterocycloalkyl group, a substituted or unsubstituted $C_3$ to $C_{30}$ cycloalkenyl group, a substituted or unsubstituted $C_6$ to $C_{30}$ aryl group, a substituted or unsubstituted $C_7$ to $C_{30}$ arylalkyl group, a substituted or unsubstituted $C_2$ to $C_{30}$ heterocycloalkenyl group, a substituted or unsubstituted $C_2$ to $C_{30}$ heteroaryl group, a substituted or unsubstituted $C_2$ to $C_{30}$ heteroarylalkyl group, a substituted or unsubstituted $C_1$ to $C_{20}$ alkylamine group, a substituted or unsubstituted $C_1$ to $C_{30}$ alkoxy group, a substituted or unsubstituted $C_6$ to $C_{30}$ aryloxy group, a substituted or unsubstituted C1 to C20 aldehyde group, a substituted or unsubstituted C1 to C40 alkylether group, a substituted or unsubstituted C7 to C20 arylalkylene ether group, a substituted or unsubstituted C1 to C30 haloalkyl group, a P-containing functional group, a B-containing functional group, or a combination thereof;

$R_{12}$ and $R_{14}$ are each independently one selected from among substituted or unsubstituted compounds represented by the following formulae:

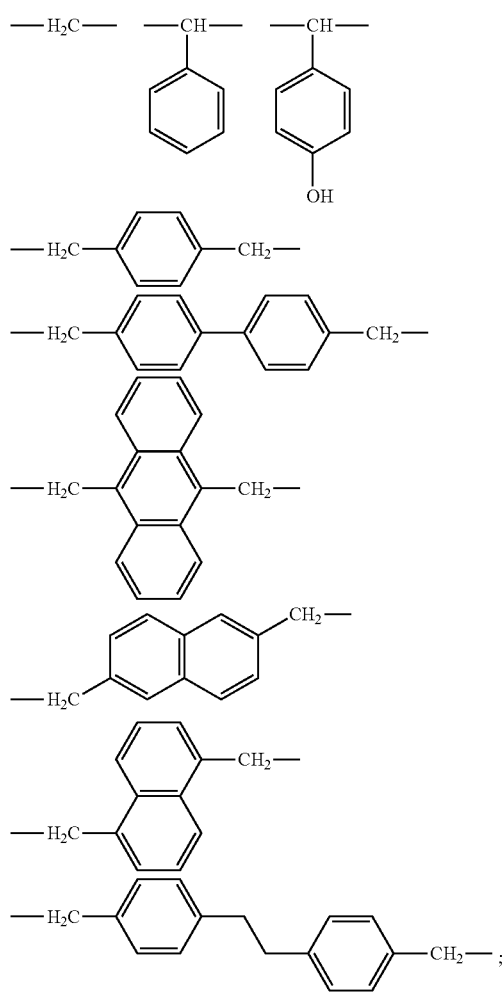
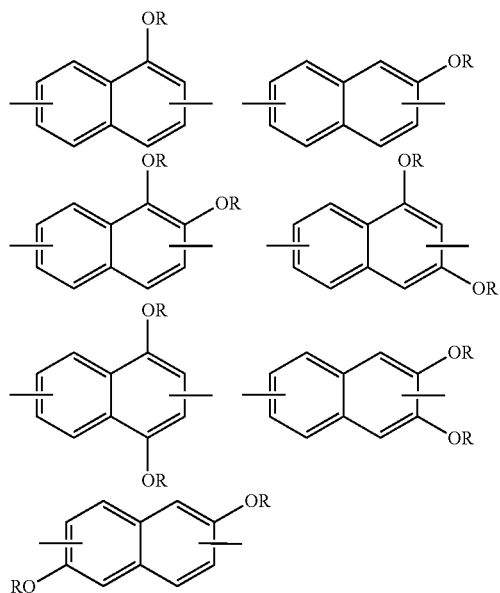
$R_{13}$ is any one selected from among substituted or unsubstituted compounds represented by the following formulae:
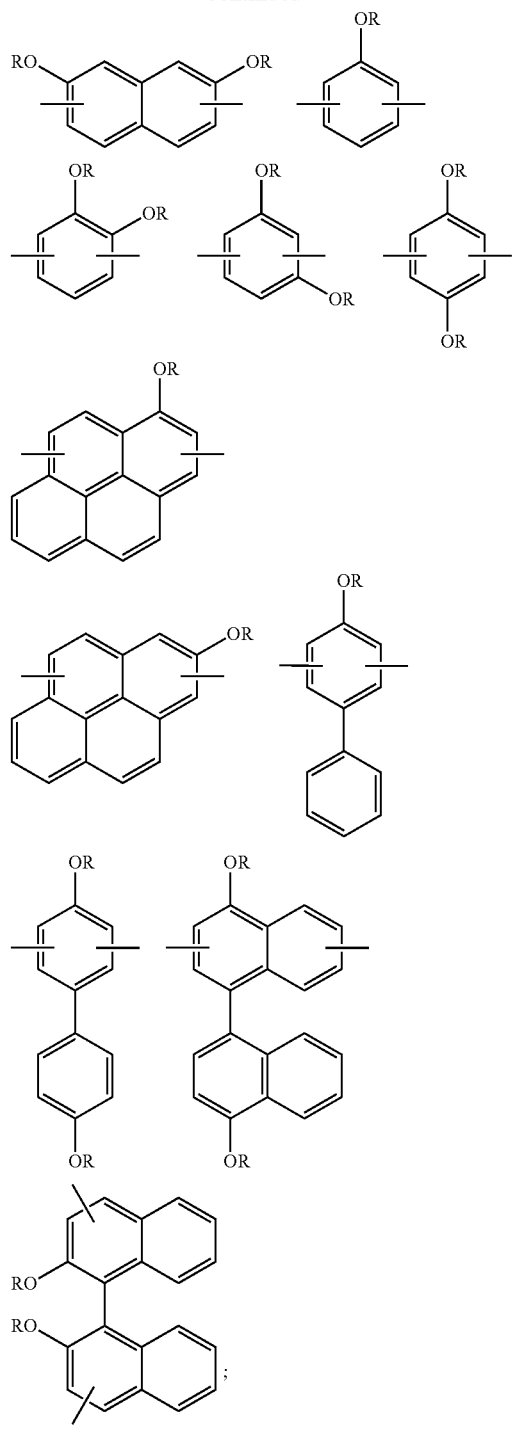
$R_{15}$ is any one selected from among substituted or unsubstituted compounds represented by the following formulae:
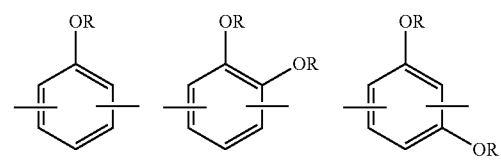

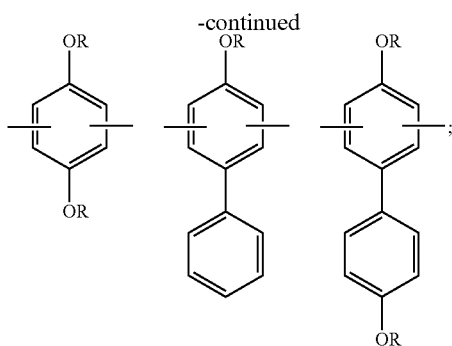

and

R's in $R_{10}$, $R_{13}$ and $R_{15}$ are each independently hydrogen, a hydroxyl group, a halogen atom, a thionyl group, a thiol group, a cyano group, a substituted or unsubstituted amino group, a substituted or unsubstituted $C_1$ to $C_{30}$ alkyl group, a substituted or unsubstituted $C_1$ to $C_{30}$ heteroalkyl group, a substituted or unsubstituted $C_2$ to $C_{30}$ alkenyl group, a substituted or unsubstituted $C_2$ to $C_{30}$ alkynyl group, a substituted or unsubstituted $C_3$ to $C_{30}$ cycloalkyl group, a substituted or unsubstituted $C_3$ to $C_{30}$ cycloalkenyl group, a substituted or unsubstituted $C_6$ to $C_{30}$ aryl group, a substituted or unsubstituted $C_7$ to $C_{30}$ arylalkyl group, a substituted or unsubstituted $C_2$ to $C_{30}$ heterocycloalkyl group, a substituted or unsubstituted $C_2$ to $C_{30}$ heterocycloalkenyl group, a substituted or unsubstituted $C_2$ to $C_{30}$ heteroaryl group, a substituted or unsubstituted $C_2$ to $C_{30}$ heteroarylalkyl group, a substituted or unsubstituted $C_1$ to $C_{20}$ alkylamine group, a substituted or unsubstituted $C_1$ to $C_{30}$ alkoxy group, a substituted or unsubstituted $C_6$ to $C_{30}$ aryloxy group, a substituted or unsubstituted $C_1$ to $C_{20}$ aldehyde group, a substituted or unsubstituted $C_1$ to $C_{40}$ alkylether group, a substituted or unsubstituted $C_7$ to $C_{20}$ arylalkylene ether group, a substituted or unsubstituted $C_1$ to $C_{30}$ haloalkyl group, a P-containing functional group, a B-containing functional group, or a combination thereof).

The organic film composition according to the third embodiment is substantially the same as the organic film composition according to the first embodiment except that the organic film composition according to the third embodiment includes the aromatic group-containing polymer instead of the compound including the unit represented by Formula 2 as the substituted or unsubstituted aromatic group-containing compound. Therefore, only the aromatic group-containing polymer will be described in detail hereinafter.

The aromatic group-containing polymer can increase carbon content, film density and hardness of the organic film after baking the organic film composition, and can be prepared by a typical method. More details are disclosed in Korean Patent No. 10-0908601.

In a fourth embodiment, the organic film composition may include at least two selected from among the compound including the unit represented by Formula 2; the compound represented by Formula 6; and an aromatic group-containing polymer selected from among the compounds (i), (ii) and (iii) as the substituted or unsubstituted aromatic group-containing compound. The organic film composition according to the fourth embodiment is substantially the same as the organic film composition according to the first embodiment except that the organic film composition according to the fourth embodiment includes at least two of the materials set forth above.

Method of Polishing Organic Film

Next, a method of polishing an organic film according to the present invention will be described.

The method of polishing an organic film according to the present invention may include polishing an organic film having a high carbon content, high film density and high hardness using a CMP slurry composition for organic films, wherein the CMP slurry composition for organic films may include the CMP slurry composition for organic films according to the embodiments of the present invention.

FIG. 1(a) is a sectional view of an organic film having a stack structure of a silicon wafer, an inorganic layer and an organic carbon layer, in which the silicon wafer 100 is subjected to patterning to have an engraved portion. The organic film is fabricated by depositing the inorganic film 110 on the silicon wafer 100, forming the organic carbon film 120 on the inorganic film, followed by baking at 200° C. to 400° C. Dashed line T in FIG. 1(a) indicates an imaginary polishing stop line. With the CMP slurry composition for organic films coated onto the organic film shown in FIG. 1(a), a polishing pad is placed on the CMP slurry composition, followed by polishing the organic film up to the polishing stop line T by rotating the silicon wafer 100, thereby obtaining a silicon wafer in which the organic film is polished, as shown in FIG. 1(b).

MODE FOR INVENTION

Next, the present invention will be described in more detail with reference to some examples. It should be understood that these examples are provided for illustration only and are not to be construed in any way as limiting the present invention.

Preparative Example 1

A 2,000 ml 3-neck flask including a thermometer, a condenser, a mechanical stirrer and a dropping funnel was dipped in a 140° C. oil bath. Heating and stirring by a magnet were performed on a hot plate and the temperature of cooling water in the condenser was set to 40° C. 220 g of 1.0 mol 1-methoxypyrene and 138 g of 1.0 mol 1,4-bis-methoxymethylbenzene were added to the reactor and then dissolved in 656 g of propylene glycol monomethylether acetate. Thereafter, 4.6 g of 0.03 mol diethyl sulfate was added to the reactor. The temperature of the reactor was maintained at 130° C. A reaction completion point was determined by measuring the molecular weight of the reaction product at regular time intervals during polymerization. Here, a sample for measuring the molecular weight was prepared by quenching 1 g of the reaction product to room temperature, followed by diluting 0.02 g of the reaction product with tetrahydrofuran, as a solvent, such that the solution had a solid content of 4 wt %. To complete reaction at the reaction completion point, 4.48 g of 0.03 mol triethanolamine was added to the reactor as a neutralizer, followed by stirring the components. Next, the reaction product was slowly cooled to room temperature. The reaction product was diluted with 500 g of propylene glycol monomethylether acetate. Next, a solvent was added to a 2000 ml separatory funnel. 4 kg of a mixture of methanol and ethylene glycol in a ratio of 90:10 g/g was prepared. The synthesized polymer solution was added dropwise to the alcohol mixture under vigorous stirring. The resultant polymer was harvested from a bottom surface of the flask and a supernatant was separately stored. After the supernatant was removed, methanol was removed from the final reaction product through rotary evaporation at 60° C. for 10 minutes under reduced pressure.

Molecular weight and dispersity of the obtained copolymer were measured by GPC using tetrahydrofuran. As a result, the polymer including a unit represented by Formula 11 having a weight average molecular weight of 4000 and a dispersity of 2.3 was obtained.

<Formula 11>

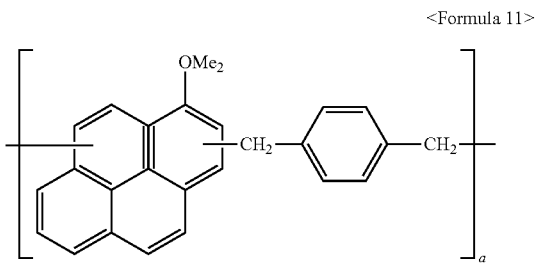

(wherein a is 11 on average and Me is a methyl group).

0.8 g of the prepared polymer, 0.2 g of a crosslinking agent (Powderlink 1174, Cytec Industries Inc.) represented by Formula 4 and 2 mg of pyridinium p-toluene sulfonate were dissolved in 9 g of propylene glycol monomethylether acetate, followed by filtering the solution, thereby preparing an organic film composition.

Preparative Example 2

A solution was prepared by adding 20.6 g of terephthaloyl chloride, 47.0 g of 4-methoxypyrene and 221 g of 1,2-dichloro ethane to a flask. Then, 27 g of aluminum chloride was slowly added to the solution at room temperature, followed by stirring at 60° C. for 8 hours. After completion of reaction, bis(methoxypyrenylcarbonyl)benzene was obtained by filtering precipitates obtained by adding methanol to the solution.

53.5 g of the obtained bis(methoxypyrenylcarbonyl)benzene, 91.1 g of 1-dodecanethiol, 30.3 g of potassium hydroxide and 262 g of N,N-dimethylformamide were added to the flask, followed by stirring at 120° C. for 8 hours. Thereafter, the mixture was cooled and neutralized to about pH 7 using a 5% hydrogen chloride solution, followed by filtering precipitates, thereby preparing bis(hydroxypyrenylcarbonyl)benzene.

A solution was prepared by adding 24.0 g of the prepared bis(hydroxypyrenylcarbonyl)benzene and 160 g of tetrahydrofuran. 16.0 g of sodium borohydride solution was slowly added to the mixture and stirred at room temperature for 24 hours. After completion of reaction, the resulting product was neutralized to about pH 7 using a 5% hydrogen chloride solution, followed by extraction using ethyl acetate, thereby preparing a compound represented by Formula 12.

[Formula 12]

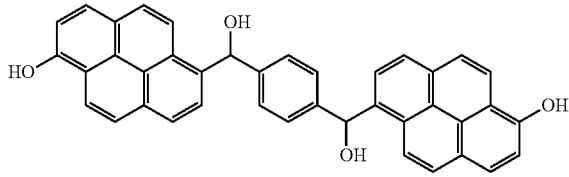

Then, 1 g of the prepared compound was dissolved in 9 g of a mixed solution of propylene glycol monomethylether acetate and cyclohexanon (7:3 (v/v)), followed by filtration, thereby preparing an organic film composition.

Example 1

A 5,000 Å thick silica layer was deposited as a polishing stop layer on a patterned wafer having an engraved pattern on a surface thereof, followed by forming a 2,650 Å thick organic film to fill the engraved pattern on the surface of the silica layer. The organic film was produced by coating the organic film composition of Preparative Example 1 onto the silica layer, followed by baking at 400° C.

The organic film composition prepared in Preparative Example 1 was applied and baked at 400° C. for 120 seconds to obtain a specimen having a thickness of 4,700 Å to 4,800 Å. Harness of the specimen was measured using Nanoindentor (Hysitron TI750 Ubi). Specifically, hardness was measured by loading a tip of a Nanoindentor on the specimen for 5 seconds, holding the tip for 2 seconds and unloading the tip for 5 seconds. The specimen had a hardness of 0.9 GPa. Carbon content was measured on the same specimen using an elemental analyzer (EA1112, Thermo Co., Ltd.). Specifically, the carbon content was measured by burning an exact amount of the specimen in the presence of $O_2$. The specimen had a carbon content of 72 atom %. Film density was measured on the same specimen using an X-ray reflectivity (XRR) tester (X'Pert PRO, PANalytical Co., Ltd.). Specifically, film density was measured by comparing a diffraction pattern obtained through X-ray irradiation of the specimen with a known diffraction pattern. The specimen had a film density of 1.4 $g/cm^3$. Acid value was measured on the same specimen. The specimen had an acid value of 0 mgKOH/g.

A CMP slurry composition including ultrapure water and components as listed in Table 1 was prepared and used for polishing under the following conditions.

Examples 2 to 6

CMP slurry compositions including components as listed in Table 1 were prepared and used for polishing in the same manner as in Example 1.

Example 7

An organic film was produced using the organic film composition of Preparative Example 2 and was polished using a CMP slurry composition including components as listed in Table 1 in the same manner as in Example 1.

Comparative Example 1

An organic film was polished in the same manner as in Example 1 except that the heterocyclic compound was not used as in Table 1.

Comparative Example 2

An organic film was produced using the organic film composition of Preparative Example 2 and was polished in the same manner as in Example 1.

(1) Details of Components of CMP Slurry Composition
  (A) Metal oxide abrasive: Ceria (SOLVAY Co., Ltd.) having an average particle diameter of 60 nm was used.

(B) Oxidant
(b1) Ferric nitrate (Junsei Co., Ltd.) was used.
(b2) Hydrogen peroxide (Dong-woo Fine Chem. Co., Ltd.) was used.
(C) Heterocyclic compound
(c1) Imidazole (Aldrich Co., Ltd.) was used.
(c2) 1-methylimidazole (Aldrich Co., Ltd.) was used.
(c3) Histidine (Aldrich Co., Ltd.) was used.
(c4) Pyrimidine (Aldrich Co., Ltd.) was used.

(2) Polishing Conditions, and Measurement of Polishing Rate and Scratch Resistance An H0800 CMP pad (FUJIBO Co., Ltd.) was used as a polishing pad. Using a 200 mm MIRRA polisher (Applied Materials (AMAT) Co., Ltd.), polishing was performed under conditions of a compressive pressure of 1.0 psi, a slurry flow rate of 200 mL/min, a table speed of 90 rpm and a spindle speed of 90 rpm for 1 minute, followed by measuring polishing rate. Results are shown in Table 1.

Defect evaluation was performed by counting the number of defects remaining on a polished surface and having a diameter of 40 nm after polishing using a polishing apparatus LS6800 (Hitachi Co., Ltd.) under conditions of 750 V or less, as measured by a detector sensor.

The degree of flatness of a polished surface was determined by evaluating whether the CMP slurry composition performed uniform polishing of an organic film as compared with an inorganic film. Thickness (unit: Å) of the polished film, which was subjected to polishing under the conditions set forth above, was measured on the polished surface of the polished film using a thin film thickness measurement instrument (ST4000. K-MAC Co., Ltd.), followed by calculating standard deviation of the polishing rate from the measured thickness. A lower degree of flatness of a polished surface indicates better flatness thereof.

TABLE 1

| No. | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| (A) Abrasive | | 0.1 | 0.1 | 0.1 | 0.1 | 0.1 | 0.1 | 0.1 | 0.1 | 0.1 |
| (B) Oxidant | (b1) | 0.3 | 0.3 | 0.3 | 0.3 | 0.3 | 0.3 | 0.3 | 0.3 | 0.3 |
| | (b2) | — | — | — | — | — | — | — | — | — |
| (C) Heterocyclic compound | (c1) | 0.1 | — | — | — | 0.005 | 0.2 | 0.1 | — | — |
| | (c2) | — | 0.1 | — | — | — | — | — | — | — |
| | (c3) | — | — | 0.1 | — | — | — | — | — | — |
| | (c4) | — | — | — | 0.1 | — | — | — | — | — |
| pH of slurry | | 2.6 | 2.7 | 2.6 | 2.7 | 2.5 | 2.7 | 2.6 | 2.5 | 2.5 |
| Organic film composition | | Preparative Example 1 | Preparative Example 1 | Preparative Example 1 | Preparative Example 1 | Preparative Example 1 | Preparative Example 1 | Preparative Example 2 | Preparative Example 1 | Preparative Example 2 |
| Polishing rate (Å/min) | | 2230 | 2400 | 2100 | 2750 | 2050 | 3100 | 1550 | 1650 | 1010 |
| Defects (ea) | | 650 | 552 | 485 | 654 | 321 | 658 | 532 | 652 | 581 |
| Flatness of polished surface | | 58 | 78 | 46 | 85 | 44 | 65 | 61 | 85 | 75 |

(unit: wt %)

As shown in Table 1, it could be seen that the CPM slurry composition according to the present invention exhibited a higher polishing rate with respect to an organic film having a high carbon content, high film density and high hardness, and provided better flatness to a polished surface than the CPM slurry compositions of Comparative Examples.

Conversely, the CPM slurry compositions of Comparative Examples 1 and 2, which included the metal oxide abrasive and did not include the heterocyclic compound, exhibited significant deterioration in polishing rate with respect to the organic film having a high carbon content, high film density and high hardness.

It should be understood that various modifications, changes, alterations, and equivalent embodiments can be made by those skilled in the art without departing from the spirit and scope of the present invention.

The invention claimed is:

1. A CMP slurry composition for organic films comprising:
   at least one of a polar solvent and a non-polar solvent;
   a metal oxide abrasive;
   an oxidant; and
   a heterocyclic compound, the heterocyclic compound having at least one and at most two heteroatoms selected from among oxygen (O), sulfur (S), and nitrogen (N), and being present in an amount of 0.001 wt % to 1 wt % in the CMP slurry composition,
   wherein the heterocyclic compound does not include histidine,
   wherein the oxidant and the heterocyclic compound are present in a weight ratio of 1:0.01 to 1:1, and
   wherein the oxidant comprises at least one of a metal salt in a polyvalent oxidation state and a transition metal chelate.

2. The CMP slurry composition for organic films according to claim 1, wherein the CMP slurry composition is capable of polishing an organic film having a carbon content of 50 atom % to 95 atom %, a film density of 0.5 g/cm$^3$ to 2.5 g/cm$^3$ and a hardness of 0.4 GPa or more.

3. The CMP slurry composition for organic films according to claim 2, wherein the organic film has a film density of 1.0 g/cm$^3$ to 2.0 g/cm$^3$ and a hardness of 1.0 GPa or more.

4. The CMP slurry composition for organic films according to claim 1, wherein the metal oxide abrasive comprises at least one of silica, alumina, ceria, titania, and zirconia.

5. The CMP slurry composition for organic films according to claim 1, wherein the metal oxide abrasive is present in an amount of 0.01 wt % to 5 wt % in the CMP slurry composition.

6. The CMP slurry composition for organic films according to claim 1, wherein the heterocyclic compound has a 5-membered ring structure or a 6-membered ring structure.

7. The CMP slurry composition for organic films according to claim 1, wherein the oxidant is present in an amount of 0.001 wt % to 5 wt % in the CMP slurry composition.

8. The CMP slurry composition for organic films according to claim 1, wherein the oxidant comprises the metal salt in a polyvalent oxidation state, and the metal salt in the polyvalent oxidation state comprises at least one of a eerie ammonium salt, a ferric nitrate, and a ferric chloride.

9. The CMP slurry composition for organic films according to claim 1, wherein the organic film has an acid value of 50 mgKOH/g.

10. A method, comprising:
   forming an organic film such that the organic film has a carbon content of 50 atm % to 95 atm %, a film density of 0.5 g/cm$^3$ to 2.5 g/cm$^3$, and a hardness of 0.4 GPa or more; and
   polishing the organic film using the CMP slurry composition for organic films according to claim 1.

11. The CMP slurry composition for organic films according to claim 1, wherein the heterocyclic compound is present in an amount of 0.001 wt % to 0.2 wt % in the CMP slurry composition.

* * * * *